United States Patent
Dorn et al.

(10) Patent No.: US 9,064,737 B2
(45) Date of Patent: Jun. 23, 2015

(54) POWER SEMICONDUCTOR MODULE

(75) Inventors: Joerg Dorn, Buttenheim (DE); Thomas Kuebel, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 908 days.

(21) Appl. No.: 12/741,737

(22) PCT Filed: Nov. 13, 2007

(86) PCT No.: PCT/EP2007/009995
§ 371 (c)(1),
(2), (4) Date: May 6, 2010

(87) PCT Pub. No.: WO2009/062534
PCT Pub. Date: May 22, 2009

(65) Prior Publication Data
US 2010/0265744 A1  Oct. 21, 2010

(51) Int. Cl.
H01L 23/34 (2006.01)
H01L 25/11 (2006.01)
H01L 23/40 (2006.01)
H01L 23/58 (2006.01)
H01L 25/07 (2006.01)

(52) U.S. Cl.
CPC .......... *H01L 25/117* (2013.01); *H01L 23/4012* (2013.01); *H01L 25/071* (2013.01); *H01L 2924/0002* (2013.01)

(58) Field of Classification Search
USPC ......... 257/683, 687, 700, 712–713, 717, 720, 257/678, 688
See application file for complete search history.

(56) References Cited

U.S. PATENT DOCUMENTS

| | | | |
|---|---|---|---|
| 4,731,644 A * | 3/1988 | Neidig | 257/687 |
| 4,878,106 A | 10/1989 | Sachs | |
| 4,963,976 A | 10/1990 | Fluegel et al. | |
| 5,081,067 A * | 1/1992 | Shimizu et al. | 228/123.1 |
| 5,646,445 A * | 7/1997 | Masumoto et al. | 257/723 |
| 5,747,875 A * | 5/1998 | Oshima | 257/687 |
| 5,977,621 A | 11/1999 | Stuck | |
| 6,087,682 A * | 7/2000 | Ando | 257/178 |
| 6,201,696 B1 * | 3/2001 | Shimizu et al. | 361/704 |
| 6,483,185 B1 | 11/2002 | Nagase et al. | |
| 6,597,585 B2 | 7/2003 | Ferber et al. | |
| 6,690,087 B2 * | 2/2004 | Kobayashi et al. | 257/686 |
| 6,885,096 B2 | 4/2005 | Hirahara et al. | |

(Continued)

FOREIGN PATENT DOCUMENTS

CN  1333566 A  1/2002
CN  200956368 Y  10/2007

(Continued)

*Primary Examiner* — Adolf Berhane
*Assistant Examiner* — Henry Lee, III
(74) *Attorney, Agent, or Firm* — Laurence A. Greenberg; Werner H. Stemer; Ralph E. Locher

(57) ABSTRACT

A power semiconductor module includes at least two power semiconductor units that are interconnected and that have controllable semiconductors. Each semiconductor unit is associated with a cooling plate to which the semiconductors are connected in a heat-conducting manner. The object is to provide a semiconductor module that is compact and cost-effective and at the same time explosion-proof. The power semiconductor module of the invention has a module housing which houses the power semiconductor units. The cooling plates form at least part of the module housing.

8 Claims, 2 Drawing Sheets

(56) References Cited

U.S. PATENT DOCUMENTS

| | | | |
|---|---|---|---|
| 6,900,986 B2 * | 5/2005 | Kimoto et al. | 361/704 |
| 7,005,739 B2 | 2/2006 | Kaufmann et al. | |
| 7,701,054 B2 | 4/2010 | Stolze et al. | |
| 2002/0024129 A1 | 2/2002 | Hirahara et al. | |
| 2003/0122232 A1 * | 7/2003 | Hirano et al. | 257/678 |
| 2003/0205806 A1 * | 11/2003 | Chang et al. | 257/725 |
| 2004/0207070 A1 | 10/2004 | Kaufmann et al. | |
| 2006/0119512 A1 * | 6/2006 | Yoshimatsu et al. | 342/372 |
| 2007/0215996 A1 * | 9/2007 | Otremba | 257/678 |
| 2012/0001317 A1 * | 1/2012 | Billmann et al. | 257/690 |

FOREIGN PATENT DOCUMENTS

| | | |
|---|---|---|
| DE | 4407810 A1 | 9/1995 |
| DE | 0989606 A2 | 3/2000 |
| DE | 102004018477 A1 | 11/2005 |
| EP | 0033399 A1 | 8/1981 |
| EP | 1172850 A2 | 1/2002 |
| EP | 1263045 A1 | 12/2002 |
| JP | 9140159 A | 5/1997 |
| JP | 10056131 A | 2/1998 |
| JP | 10163417 A | 6/1998 |
| JP | 2002026251 A | 1/2002 |
| JP | 2004528724 A | 9/2004 |
| JP | 2007287784 A | 11/2007 |
| JP | 2008042089 A | 2/2008 |
| RU | 25250 U1 | 12/2011 |
| WO | 0215268 A2 | 2/2002 |

* cited by examiner

POWER SEMICONDUCTOR MODULE

BACKGROUND OF THE INVENTION

Field of the Invention

The invention relates to a power semiconductor module comprising at least two interconnected power semiconductor units having drivable power semiconductors, each power semiconductor unit being assigned a cooling plate to which the drivable power semiconductors are thermally conductively connected.

The invention furthermore relates to a converter valve branch comprising a series circuit formed by such power semiconductor modules, and to a converter comprising such converter valve branches.

Such a power semiconductor unit is already known from DE 303 21 33. The power semiconductor unit described therein has pressure-contact-connected power semiconductors clamped between two electrodes. One of the electrodes has connections for cooling lines and therefore simultaneously serves as a cooling plate.

Commercially available power semiconductor units are generally already equipped with a housing and a cooling plate. Electrical interconnections of such units are also known. EP 0 845 809 A2 describes a power semiconductor unit having a housing with a cooling plate. The housing is filled with a foam in order to absorb explosion forces in the case of an explosion. Power semiconductor chips are arranged on the cooling plate, bonding wires for interconnecting the power semiconductor chips being provided. The previously known power semiconductor unit has the disadvantage that it can be combined with a further power semiconductor unit to form a power semiconductor module only in a complicated manner, with the consequence of a bulky construction. Particularly in the case of use in the field of high-voltage and heavy-current engineering, the bonding wires can melt and arcing can occur, with explosive gases arising. On account of this undesirable hazard source, the previously known power semiconductor module has been unable to gain acceptance in practice in the field of power transmission and distribution.

BRIEF SUMMARY OF THE INVENTION

The invention is based on the object of providing a power semiconductor module of the type mentioned in the introduction which is compact and cost-effective in its construction, protection in the case of explosion being provided at the same time.

The invention achieves this object by virtue of the fact that a module housing is provided, in which the power semiconductor units are arranged, the cooling plates of the power semiconductor units forming at least one part of the module housing.

According to the invention, a power semiconductor module comprising at least two power semiconductor units is provided. The power semiconductors of each power semiconductor unit are thermally conductively connected to a cooling plate, as is already known from the prior art. According to the invention, both power semiconductor units are arranged in a common module housing. In this case, the cooling plate of each power semiconductor unit forms a boundary wall of the module housing of the power semiconductor module. The power semiconductor module according to the invention is therefore composed of a plurality of semiconductor units, the power semiconductor units having a dedicated unit housing, for example, in which, expediently, interconnected power semiconductor chips are arranged. The power semiconductor module according to the invention is connected in parallel with an energy store, for example. The power semiconductor module and the energy store then together form a branch module, such branch modules being connected in series with one another to form a converter valve branch. Such converter valve branches in turn serve as a phase component for a so-called multilevel converter such as can be used for example in the field of power transmission and distribution. Furthermore, applications in the field of drive technology are also conceivable, however.

By virtue of the fact that the cooling plates of the power semiconductor units simultaneously also constitute the housing walls for the power semiconductor module, a compact component is provided according to the invention. Furthermore, the generally mechanically stable cooling plates serve as protection against explosion.

Drivable power semiconductors are for example power semiconductors capable of being turned off, such as IGBTs, GTOs, IGCTs or the like, but also power semiconductors not capable of being turned off, such as thyristors. In the context of the invention, the power semiconductor unit can also have power semiconductors, such as diodes, freewheeling diodes or the like, which are non-drivable.

The module housing expediently has module sidewalls which extend between the cooling plates and which are produced from an electrically non-conductive insulating material such as, for example, ceramic, plastic or the like. In a departure therefrom, in the context of the invention, the module sidewalls are also composed of an electrically conductive material.

Connection terminals for connecting the power semiconductor units are expediently provided, the connection terminals extending through at least one of the module sidewalls. A structurally simple connection for the power semiconductor module is provided in this way.

The power semiconductor units advantageously face one another. This firstly affords advantages with regard to the propagation of explosive gases or hot gases, such that the explosion forces are absorbed by the mechanically fixed cooling plates. Furthermore, a simple busbar system with the connection terminals is also made possible.

The module housing is expediently filled with fillers, such as thermally stable foams, plastics or the like, for further damping in the case of explosion.

The power semiconductors are advantageously connected to one another by means of bonding wires. Such power semiconductor units are commercially available cost-effectively with a wide variety.

The power semiconductor module advantageously has at least one holding ring which is fixedly connected to a cooling plate and which forms a sidewall section projecting from the cooling plate, said sidewall section at least partly enclosing a power semiconductor unit. The holding ring, which is composed of a mechanically strong material and for example of metal or steel, provides additional protection against explosion.

As has already been explained further above, it is expedient for such a power semiconductor module to be connected in parallel with an energy store, such as a capacitor, to form a converter valve branch module. A series circuit comprising converter valve branch modules expediently forms a converter valve branch which, by way of example, is connected to a phase of an AC voltage supply system via an AC voltage connection and to a DC voltage intermediate circuit via a DC voltage connection. The series circuit then extends between the AC voltage connection and the DC voltage connection.

Further expedient configurations and advantages of the invention are the subject of the following description of exemplary embodiments of the invention with reference to the figures of the drawing, wherein identical reference symbols refer to components that act identically, and wherein

DESCRIPTION OF THE INVENTION

Figure 1:
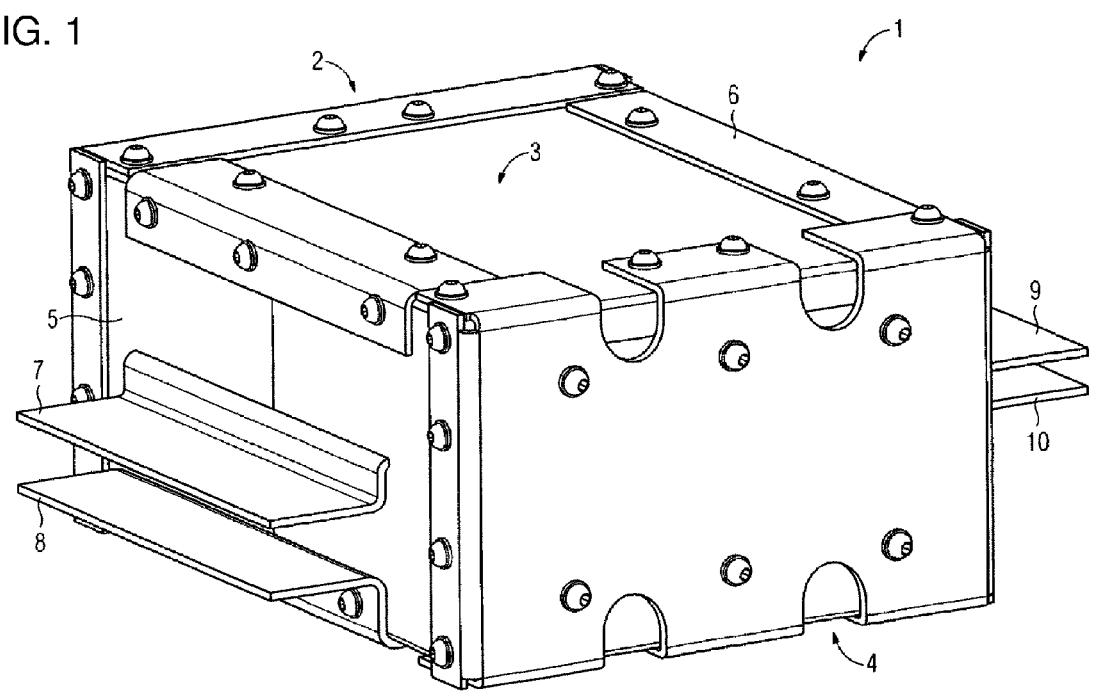
FIG. 1 shows a perspective illustration of an exemplary embodiment of the power semiconductor module according to the invention.

FIG. 1 shows an exemplary embodiment of the power semiconductor module 1 according to the invention in a perspective illustration. The power semiconductor module 1 shown has a module housing 2, which is composed of an upper module housing wall 3, a lower module housing wall 4 and module sidewalls 5. Profile rails 6 are provided for the mechanical connection of the module housing walls 3, 4 and the module sidewalls, said rails being fixedly screwed to the respective walls. Front connection terminals 7 and 8 and rear connection terminals 9 and 10 are provided for the electrical connection of the power semiconductor module 1. The connection terminals 8 and 10 are at a ground potential, while the connection terminals 7 and 9 are at a comparatively higher potential, for example 1 kilovolt.

Figure 2:
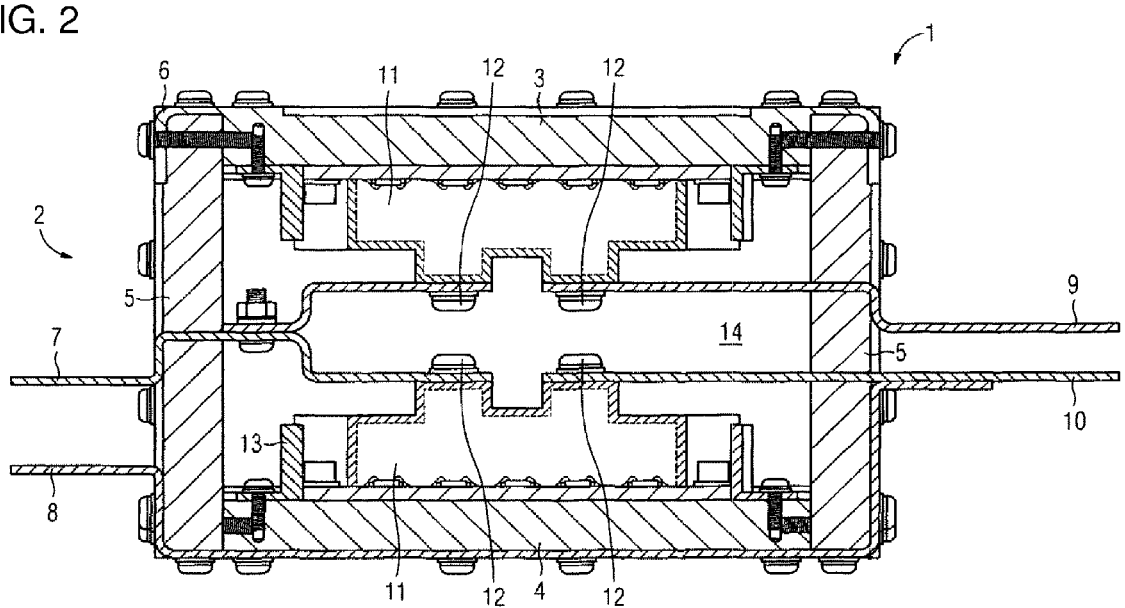
FIG. 2 shows a cross-sectional side view of the power semiconductor module according to FIG. 1.

FIG. 2 shows the power semiconductor module 1 in accordance with FIG. 1 in a cross-sectional side view, in which the upper module housing wall 3, the lower module housing wall 4 and the module sidewalls 5 can be better discerned. In particular, the illustration shows that the upper module housing wall 3 and lower module housing wall 4 are respectively connected to a power semiconductor unit 11. Each of the power semiconductor units 11 has, in its interior, schematically illustrated power semiconductors connected to one another by means of bonding wires and other conductor tracks. Connections 12 serve for connecting the power semiconductor units 11 to the connection terminals 7, 8, 9, 10. The electrical connection of the connections 12 to the power semiconductors or power semiconductor chips indicated schematically in FIG. 2 is not illustrated in FIG. 2 for reasons of clarity. The connection that is not illustrated is fashioned in any desired manner in the context of the invention.

The power semiconductor units 11 are constructed identically and are arranged in a manner facing one another, such that their power semiconductors or power semiconductor chips are thermally conductively connected to the upper module housing wall 3 and the lower module housing wall 4, respectively. Said module walls 3, 4 simultaneously serve as cooling plates 3, 4 of the power semiconductors of the power semiconductor units 11. In other words, the cooling plates 3, 4, which are necessary anyway for the operation of the power semiconductor units 11, simultaneously form the upper and lower boundary wall, respectively, of the power semiconductor module 1. A cost-effective module housing 2 is provided in this way. In this case, the compact and cost-effective housing 2 simultaneously forms protection against explosion.

The power semiconductor units 11 are commercially available power semiconductor units which, for their part, generally themselves have a unit housing, in which in turn power semiconductor chips as power semiconductors are arranged. In the exemplary embodiment of the invention shown, the power semiconductor chips of the power semiconductor units 11 are connected to one another at least in part by means of bonding wires. On account of this connection of the power semiconductor chips of the power semiconductor units 11, melting of the bonding wires can occur particularly in the case of high short-circuit currents, with the consequence of development of arcing. The arc liberates explosive gases which, on account of the arrangement of the power semiconductor units 11 facing one another, are substantially directed toward the robust opposite cooling plate 3, 4 as upper and lower housing wall.

Each power semiconductor unit 11 is surrounded by a holding ring 13, which is fixedly screwed by its flange section on the respective cooling plate 3, 4. That sidewall section of the holding ring 13 which projects from the respective cooling plate 3, 4 encloses the respective power semiconductor unit 11 and thus forms additional protection against explosion. The holding ring 13 is produced from steel, for example.

In order to increase the explosion capability of the power semiconductor module even further, a filling space 14 is provided between the connections 12 of the power semiconductor units 11, a thermally stable filler being arranged in said filling space. The filler is a nonconductive thermally stable plastic, for example. In the case of explosion, the plastic deforms and absorbs explosion energy liberated in the process.

In the exemplary embodiments shown, the module sidewalls 5 are produced from a nonconductive insulating material, for example a glass-fiber-reinforced plastic, although metallic, that is to say electrically conductive, materials are also likewise appropriate for the module sidewalls 5. The connection terminal 7 and the connection terminals 9 and 10 respectively pass through the module sidewalls 5, with the result that simple external connection of the power semiconductor module 1 is made possible. In the case of electrically conductive module sidewalls 5, the connection terminals 7, which are at a potential which deviates from that of the module sidewalls 5 passed through, are insulated from said module sidewall 5 by means of expedient insulating units. In one expedient further development, commercially available bushings are fixed to the module sidewall 5, which enable the connection terminals 7 to pass through the respective module sidewall 5 in an insulated fashion.

The power semiconductor module 1 is advantageously connected in parallel with a capacitor or some other energy store, the parallel circuit that comprises power semiconductor module 1 and energy store forming a branch module. A series circuit comprising branch modules in turn forms a converter branch that is part of a multilevel converter. Such multilevel converters are used in high-voltage direct-current transmission, for example.

The invention claimed is:

1. A power semiconductor module, comprising:
   a module housing having a top side and an underside;
   at least two power semiconductor units disposed in said module housing, each of said at least two power semiconductor units having a unit housing and drivable power semiconductors disposed in said unit housing, and said unit housings being connected to one another;
   each power semiconductor unit of said power semiconductor units having a respective cooling plate thermally conductively connected to said drivable power semiconductors;

said cooling plates of said power semiconductor units forming said top side of said module housing and said underside of said module housing.

2. The power semiconductor module according to claim 1, wherein said power semiconductor units are disposed facing one another.

3. The power semiconductor module according to claim 1, wherein said module housing has sidewalls extending between said cooling plates and being composed of an insulating material.

4. The power semiconductor module according to claim 3, which comprises connection terminals for connecting said power semiconductor units, said connection terminals extending through the sidewalls.

5. The power semiconductor module according to claim 1, wherein said power semiconductors are connected to one another by way of bonding wires.

6. The power semiconductor module according to claim 1, which comprises at least one holding ring fixedly connected to a respective said cooling plate, said holding ring having a sidewall section projecting from said cooling plate and at least partly enclosing a respective said power semiconductor unit.

7. A current converter valve branch, comprising a series circuit of a plurality of power semiconductor modules according to claim 1.

8. A current converter, comprising a bridge circuit formed of a plurality of converter valve branches each formed of a series circuit of a plurality of power semiconductor modules according to claim 1.

* * * * *